United States Patent [19]
Weil

[11] Patent Number: 5,383,167
[45] Date of Patent: Jan. 17, 1995

[54] METHOD AND APPARATUS FOR HISTOGRAM BASED DIGITAL CIRCUIT SIMULATOR

[75] Inventor: Paul B. Weil, Fremont, Calif.

[73] Assignee: Nextwave Design Automation, San Jose, Calif.

[21] Appl. No.: 777,451

[22] Filed: Oct. 16, 1991

[51] Int. Cl.⁶ .......................................... G01R 27/00
[52] U.S. Cl. .................................. 364/488; 364/487; 364/489
[58] Field of Search ................. 324/121 R; 364/487, 364/563, 488, 489, 490, 491; 354/430; 358/222; 381/36; 368/118

[56] References Cited

U.S. PATENT DOCUMENTS

| | | | |
|---|---|---|---|
| 4,495,585 | 1/1985 | Buckley | 364/487 |
| 4,559,602 | 12/1985 | Bates, Jr. | 364/487 |
| 4,843,309 | 6/1989 | Kareem et al. | 324/121 R |
| 4,985,844 | 1/1991 | Foley et al. | 364/487 |
| 5,003,248 | 3/1991 | Johnson | 324/121 R |
| 5,008,940 | 4/1991 | Blum | 381/31 |
| 5,028,914 | 7/1991 | Povenmire | 340/720 |
| 5,081,592 | 1/1992 | Jenq | 364/487 |
| 5,095,454 | 3/1992 | Huang | 364/578 |
| 5,153,501 | 10/1992 | Shimada et al. | 324/121 R |

Primary Examiner—Thomas G. Black
Assistant Examiner—Stephen J. Walder, Jr.
Attorney, Agent, or Firm—D'Alessandro, Frazzini & Ritchie

[57] ABSTRACT

A digital circuit simulator is provided that combines the speed of a single pass simulator with the probabalistic analysis previously available only through lengthy iteration, and that avoids the extensive reporting of false errors typical to single pass simulators. The simulator represents signal level transitions and component gate delays by probability histograms. Circuit operation is divided into events, each of which is the propagation through a single component of transitions in one or more input signals to the component. Signal propagation through a component is analyzed using component models, which are provided for a variety of basic components; more complex components are represented by decomposing them into a corresponding structure of basic components. Each event is analyzed using the histograms for the input signals and for the component gate delay.

Signal conflicts due to timing problems between the various inputs to a component are identified and reported. Potential signal conflicts include spike and race conditions, glitches, and set-up and hold time problems. Probabilities are reported with the signal conflicts, which permitting the conflicts to be ranked according to their likelihood of occurrence.

28 Claims, 10 Drawing Sheets

Microfiche Appendix Included
(324 Microfiche, 4 Pages)

METHOD AND APPARATUS FOR HISTOGRAM BASED DIGITAL CIRCUIT SIMULATOR

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

SOURCE CODE APPENDIX

A microfiche appendix containing 4 pages and 324 frames of c language source code for a preferred embodiment is filed herewith.

BACKGROUND OF THE INVENTION

The present invention relates generally to a method and apparatus for simulating digital circuits. In particular, the present invention relates to a method for rapidly modeling and statistically analyzing digital circuits to detect signal timing problems.

Digital circuit simulators have been known for many years, and are typically used to test new circuit designs without physically building expensive prototypes. One major purpose of this testing is to ensure that during real-time operation there will not be any signal timing conflicts that might cause the circuit to operate improperly. Such timing conflicts can result in undesired pulses and logic values as a consequence of circuit elements receiving information in an inappropriate order. For example, a digital latch must receive the data state before the latch signal. The amount of time that the data must be stable prior to the latch signal is called setup time. If a data signal violates the setup time (i.e. there is a data signal transition too close to the latch signal), the output of the latch may be set to an incorrect value.

Many digital simulation methods focus on modeling delay time in signal propagation through components. The simplest simulation method is known as fixed delay modeling. This method models each component with a predetermined, fixed delay. Real components, however, have propagation delays that vary considerably due to transistor variations, differences in circuit operation, temperature, supply voltage, etc. For this reason fixed delay modeling detects only a small fraction of the potential signal conflicts.

Two different approaches have been developed in response to the inadequacies of fixed delay modeling. These are commonly known as Monte Carlo and Min/Max simulators. Monte Carlo simulators perform repetitive fixed delay analyses, with each analysis using delay parameters randomly selected according to a distribution describing the variation in component delays. The results from each analysis are retained and combined together to form the distribution of delay through the network. When the analyses have all been completed, the output provides a more comprehensive list of conflicts than provided by simple fixed delay modeling. Also, the ratio of the number of occurrences of a particular error to the total number of analyses provides a probability for the occurrence of the error. Because of the randomized selection process, however, Monte Carlo analysis has the significant drawback that a great many analyses must be performed to achieve statistically significant results, requiring a great deal of time for the complete simulation.

As its name implies, the Min/Max method represents delay and signal transition ranges by their minimum and maximum values. Min/Max simulations, like fixed delay simulations, are determinate simulators requiring but a single simulation pass, and are therefore much faster than Monte Carlo simulations. Unfortunately, the results of a Min/Max simulation represent extended extremes. This type of analysis can only identify the potential duration of a signal conflict, which is essentially unrelated to its likelihood of occurrence, and therefore of limited usefulness in ranking problems to be addressed. Min/Max simulations thus report a large number of potential errors that realistically have only an infinitesimal likelihood of occurrence. Min/Max analysis has been augmented in order to reduce this excessive reporting of illusory errors. One augmentation is the use of reconvergent fanout analysis in conjunction with the normal Min/Max analysis. Reconvergent fanout analysis accounts for some of the potential correlation between different logic signals, and improves accuracy. However, Min/Max analysis is still not very satisfactory.

What is needed is a fast, determinate, single pass digital circuit simulator that can accurately determine probability ratings for signal conflicts.

SUMMARY OF THE INVENTION

A digital circuit simulator according to the invention combines the speed of a single pass simulator with probabalistic analysis previously available only through lengthy iterations of randomized analysis. Extensive reporting of false errors, typical to single pass simulators, is also avoided. The need for iteration is bypassed by directly incorporating statistical information into the circuit model and analysis, so that a single simulator pass can produce probabalistic event results determinately (i.e. through equations not relying on repetition with randomized conditions).

A simulator according to the invention represents signal level transitions and component gate delays by segmented probability distributions, which in the preferred embodiment are histograms. Each histogram has an overall time range and is divided into sub-ranges, each of which has a defined probability associated with it. For signal level transitions, the probability associated with a particular sub-range denotes the likelihood that the transition will occur during that time sub-range. For component gate delays, the probability associated with a particular sub-range denotes the likelihood that the delay will fall within that time delay sub-range.

The simulator divides the circuit operation into events, each of which represents the propagation through a single component of transitions in one or more input signals to the component. Signal propagation through a component is analyzed using component models. A variety of basic components are directly modeled, and more complex components are represented by decomposing them into a corresponding structure of basic components. Each event is analyzed by first combining the event input signals according to the particular component model to produce an intermediate result signal, also represented as a probability distribution, which contains the time variations resulting from the time variations of the combined input signals. Next, this intermediate result distribution is statistically convolved with the component delay distribution to produce the event output signal, which in turn may be an input to a later component.

In the process of evaluating events the simulator identifies and reports signal conflicts due to timing problems between the various inputs to a component. Potential signal conflicts identified by the preferred embodiment include spike and race conditions, glitches, set-up and hold time problems. The signal transition probability distributions allow probabilities to be reported with the signal conflicts, which permits the conflicts to be ranked according to their likelihood of occurrence.

A further understanding of the nature and advantages of the invention may be realized by reference to the remaining portions of the specification and the drawings.

DESCRIPTION OF THE PREFERRED EMBODIMENT

This description is sufficiently detailed for an understanding of the invention, but for those interested in more details of implementation a microfiche appendix containing source code for a preferred embodiment is attached, and references to specific portions within it are provided. Module names below correspond directly to the actual code routine names in the appendix. This source code is written in standard C (as documented in "The C Programming Language" by Kernigan and Ritchie, published by Prentice Hall), and is intended for computers running under the UNIX operating system and having at least four megabytes of real memory.

Overview

Figure 1:
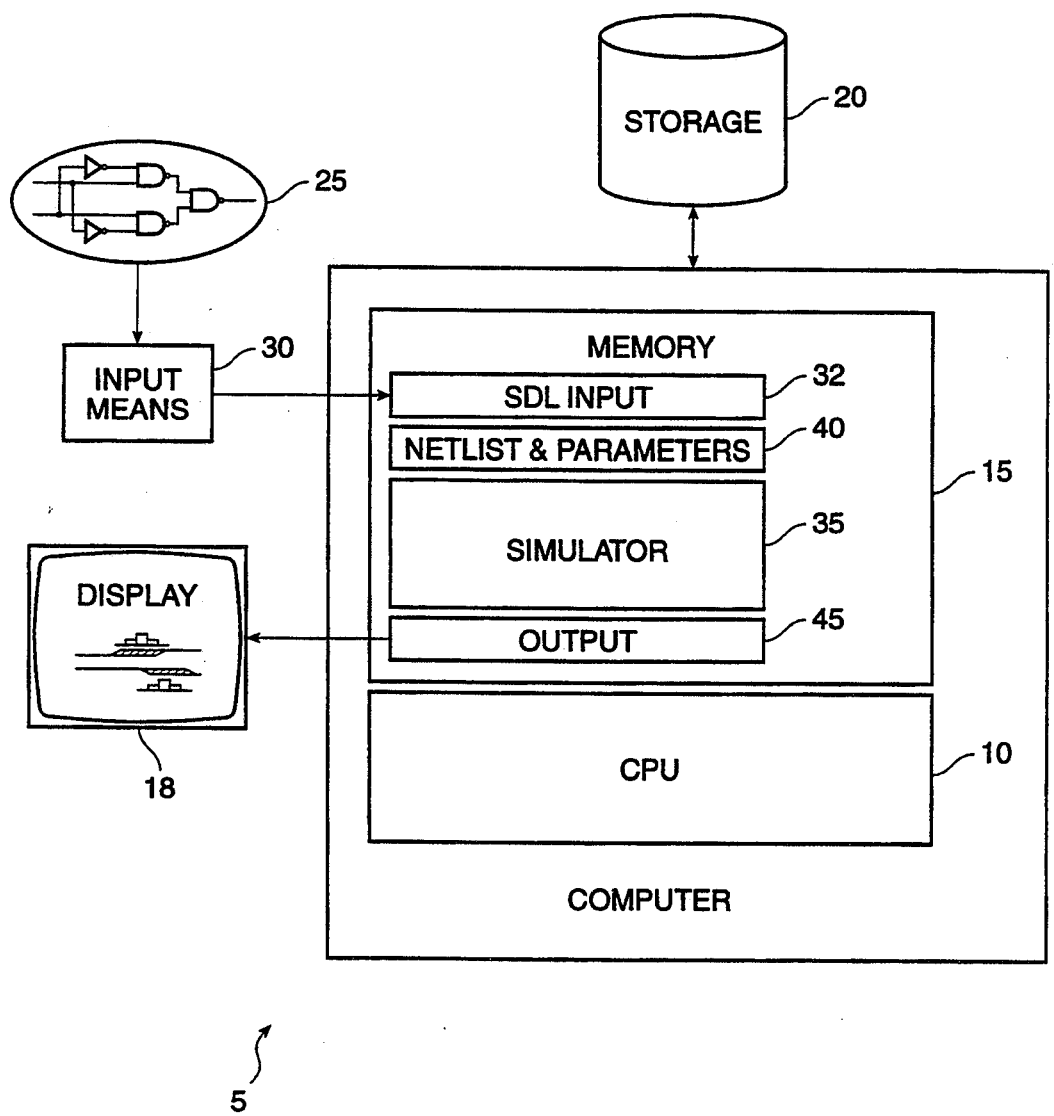
FIG. 1 is a block diagram illustrating the basic functioning of a simulator according to the present invention.

FIG. 1 illustrates the basic functioning of a simulator according to the present invention from a user's point of view. Computer system 5 has a cpu 10, internal memory 15, display terminal 18, and may have external storage 20. Below, "memory" refers to any combination of internal and other storage, according to the virtual memory capabilities of the computer. Circuit 25 is provided to computer system 5 by way of input means 30, which generates a Simulation Design Language (SDL) input 32, which describes the models of a circuit design and their manner of interconnection. The specification of this SDL can be found in the language_processor routine in the attached source code appendix. Input means 30 may comprise any of a number of standard schematic capture means. Computer system 5 is configured by simulator code 35. Simulator configured computer system 5 creates a netlist and parameters 40 from the information from input means 30. Then computer 5 analyzes the operation of circuit 25, and generates an output report 45 that may contain waveform charts for selected signals, and also a listing of possible circuit errors. Additional graphics packages may be used to display report 45 on display terminal 18, simulator code 35 may contain such display code itself, or the report may simply be printed in some form.

Histograms

Signal level transitions and component delays are preferably represented by segmented (piece-wise) probability functions, which in the preferred embodiment are histograms. These histograms have five segments, each segment having a time range and a probability that the given event will occur during that time range. The histogram segment time ranges are contiguous and of equal width.

System Organization

Figure 2:
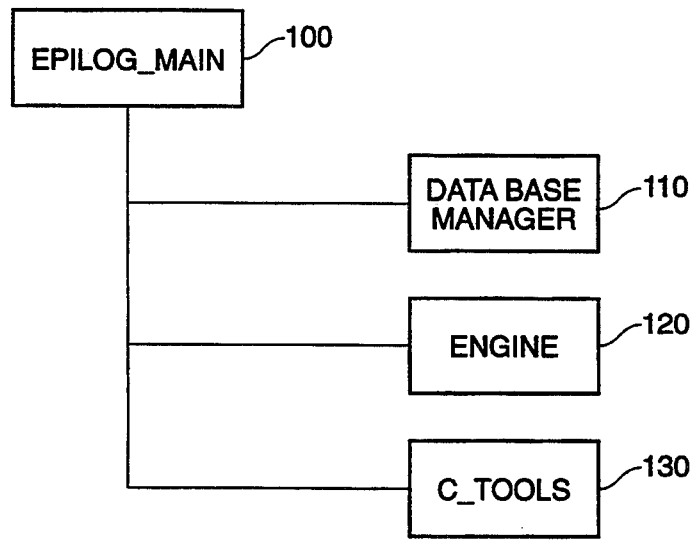
FIG. 2 is a block diagram illustrating the main components of the preferred embodiment.
Figure 3:
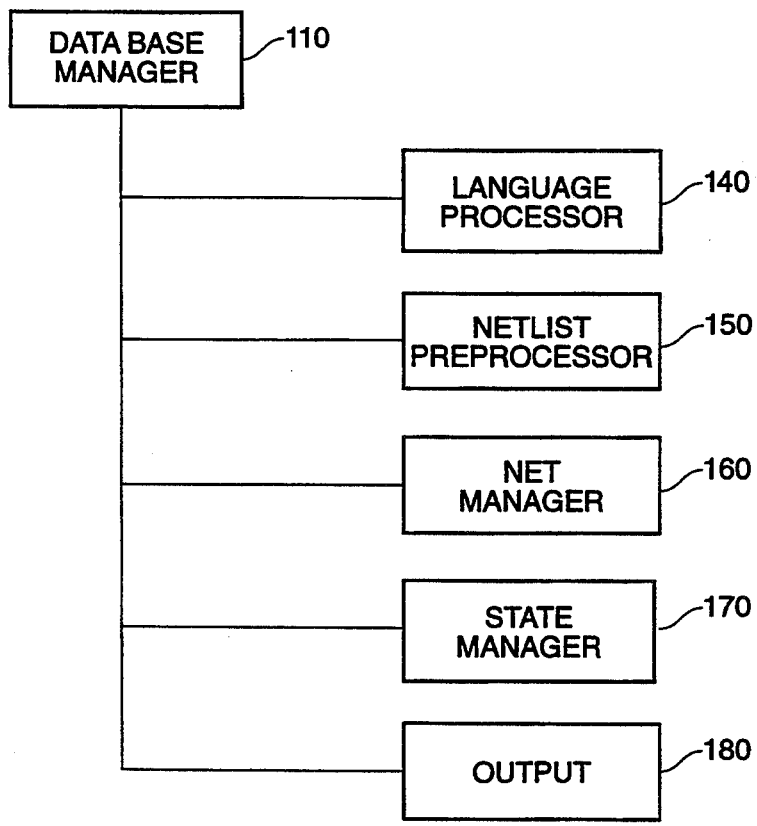
FIG. 3 is a block diagram illustrating the components of the data base manager of the present invention.
Figure 4:
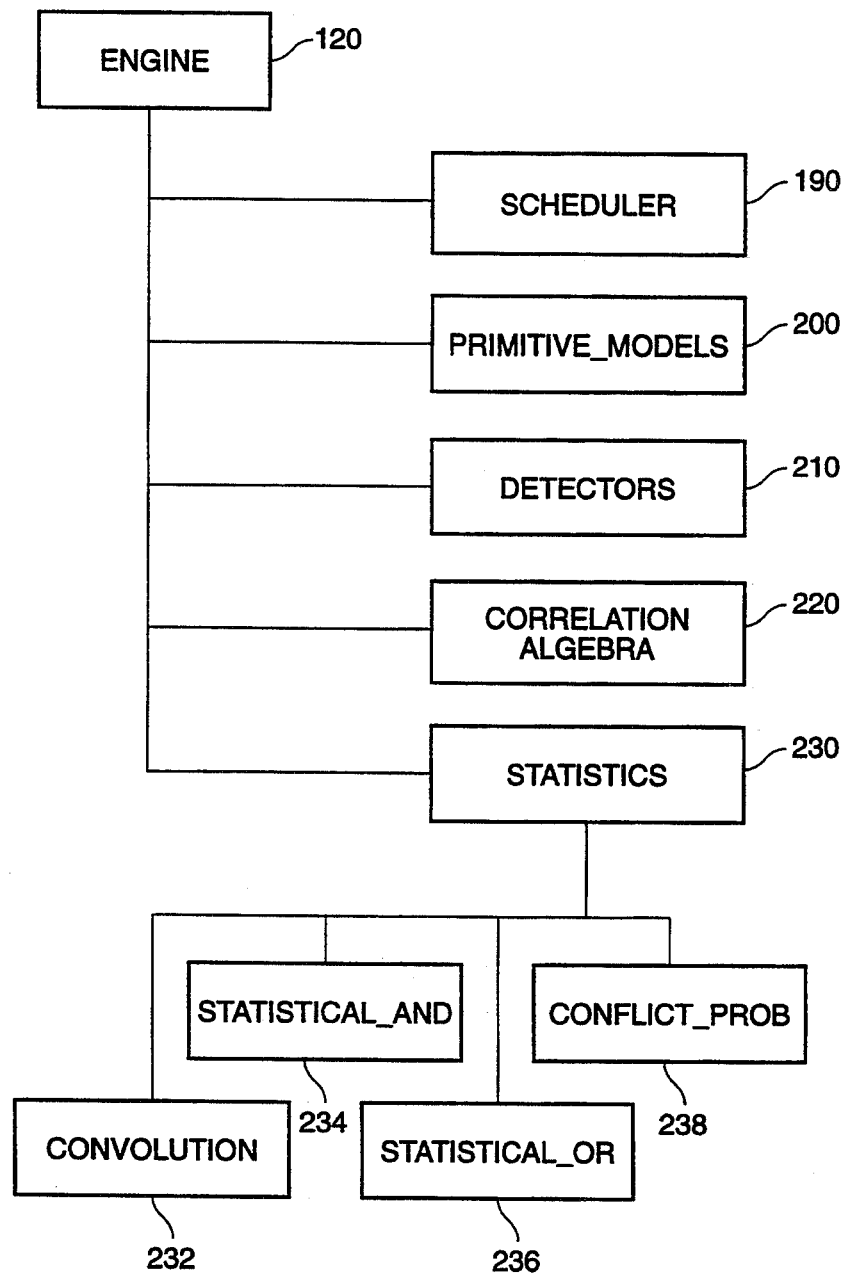
FIG. 4 is a block diagram illustrating the components of the simulation engine of the present invention.

The simulator code 35 of the preferred embodiment is organized in three main sections accessed by a main coordinator 100, as illustrated in FIG. 2. These main sections are a data base manager 110 for managing simulation data, simulator engine 120 for evaluating circuit operation, and c-tools library 130 for providing utility routines to all portions of the simulator. Data base Manager 110 comprises of a number of sub-modules, illustrated in FIG. 3. These sub-modules include language processor 140, netlist preprocessor 150, net manager 160, state manager 170 and output module 180. Simulator engine 120 also comprises a number of sub-modules, as illustrated in FIG. 4. These are scheduler 190, primitive models 200, detectors 210, correlation algebra 220 and statistics 230. Statistics sub-module 230 itself includes four sub-modules, convolution 232, statistical_and 234, statistical_or 236, and conflict_probability 238. C-tools 130 comprises a great number of utility routines, which will not be individually listed here, but are included in the appendix. Some of the functions provided by these tools are management of linked lists, hash tables and binary trees. Search routines, parsing functions, and memory management are also provided.

Simulation Operation

Language processor 140 and netlist preprocessor 150 together create the circuit and control information used by simulation engine 120. The SDL description from input means 30 (FIG. 1) is read by language processor 140, which builds data structures used in the subsequent analysis. The SDL description includes descriptions of modeling information for the circuit components, and may also contain control information such as input signals for the particular simulation session. Complex components are degenerated into sub-components corresponding to primitive models. Some of the data structures created by language processor 140 form a netlist describing component and signal interconnections; this netlist is processed by netlist preprocessor 150 to set up data structures used to track correlation. During the simulation analysis, certain types of data remain static while other types vary. Net manager 160 maintains the static data, such as the netlist, during simulation, and state manager 170 maintains the dynamic data, which includes signal levels and transitions. During simulation net manager 160 and state manager 170 interact with the components of the simulation engine, providing data support.

Once language processor 140 and netlist preprocessor 150 have provided all the necessary information to net manager 160, simulation engine 120 is called. The sequence of evaluations by simulation engine 120 is controlled by scheduler 190. Scheduler 190 examines the netlist and determines an initial sequence of events for evaluation. Each event involves the propagation of at least one level transition (low to high, high to low) of at least one input signal to a component. Once the event is evaluated, resultant events are schedule for subsequent evaluation of the effects of a transition in the output signal on the components to which it is connected.

Figure 5A:
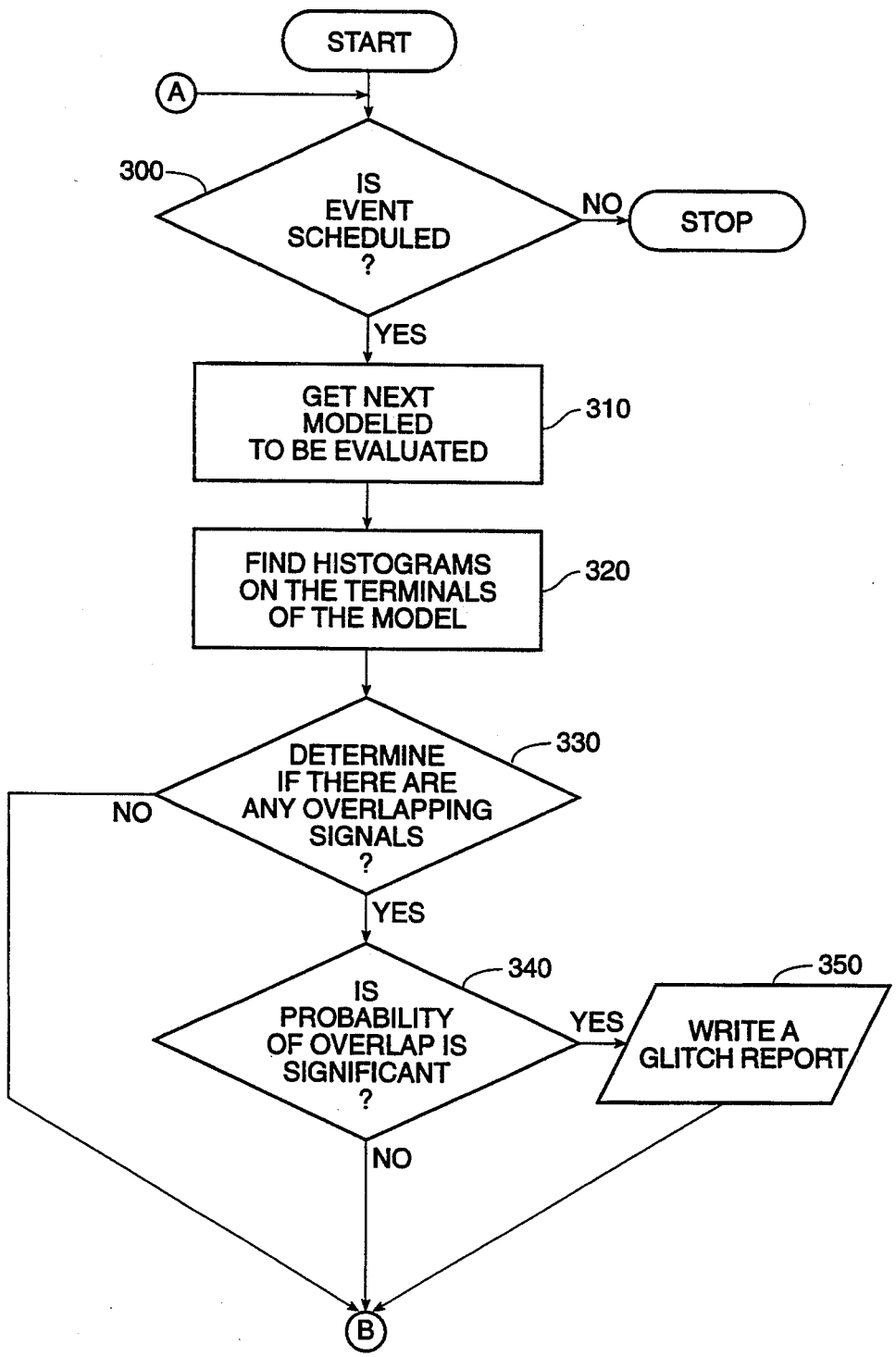
FIGS. 5A and 5B are flowcharts illustrating the main simulation loop of the preferred embodiment.
Figure 5B:
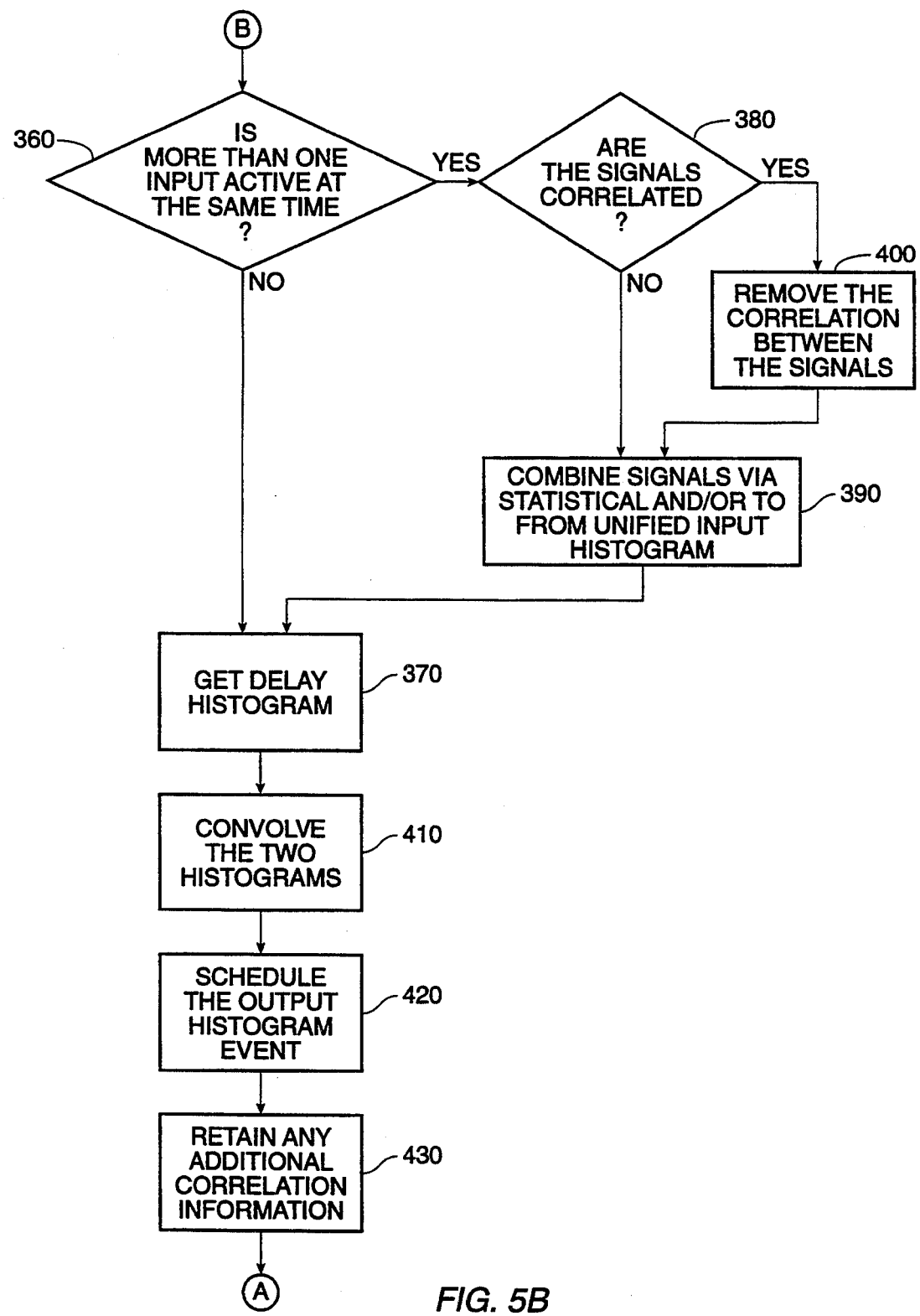

The operation of simulation engine 130 is illustrated by the flowcharts of FIGS. 5A and 5B. Once the initial events have been scheduled, program flow begins at point A and passes directly to the beginning of the simulation main loop, block 300. Block 300 determines if there are any remaining scheduled events. If not, simulation engine 120 ends the circuit analysis. If events remain, the next event is selected by time priority and evaluated. In block 310, the primitive model describing the circuit component of the event is determined. Primitive models 200 are executable routines that the simulator uses to analyze circuit operation. These models include gates of many varieties and also latches that store logic state. Then the model is called and retrieves the terminal signal values and other parameters, as indicated in block 320. The component delay and signal values include the histogram distribution of the timing variations and signal states. Next, in block 330, conflict_probability 238 is called to analyze the timing of level transitions in input signals to a component, in order to monitor signal transition overlap and other signal timing conflicts, such as illustrated in FIGS. 6A–6B.

Figure 6A:
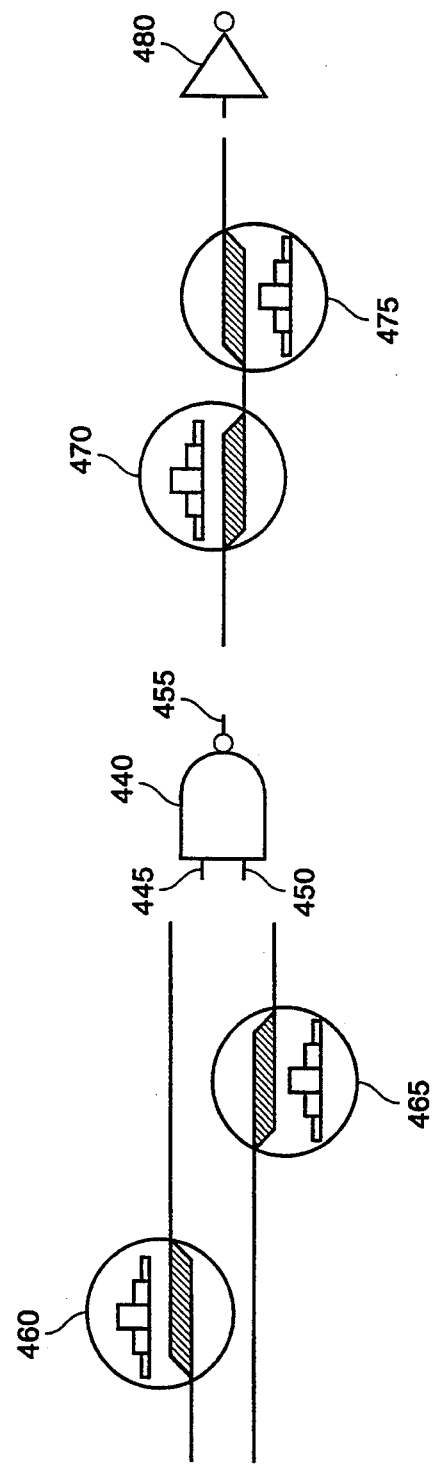
FIGS. 6A and 6B illustrate a signal transition glitch detected by the conflict analysis of the preferred embodiment.
Figure 6B:
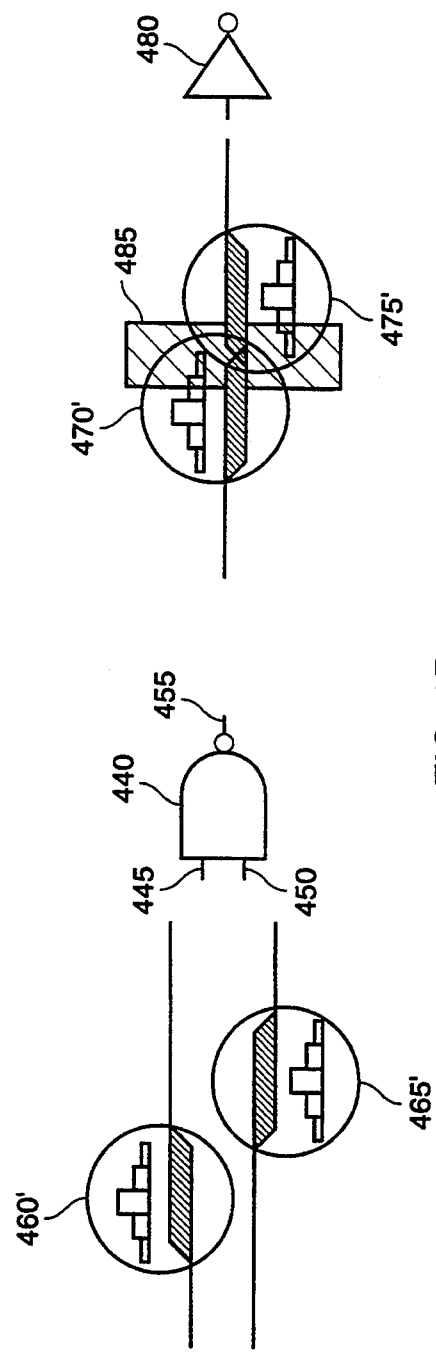

FIG. 6A illustrates a nand gate 440 having inputs 445 and 450, and an output 455. The two inputs 445 and 450 each have transitions, 460 and 465 respectively, that result in output transitions 470 and 475, respectively. Input transitions 460 and 465 are sufficiently spaced in time that no overlap occurs in output transitions 470 and 475. In the conflict analysis of inverter 480, for which nand gate output 455 serves as an input, no glitch is detected. In the illustration of FIG. 6B, however, input transitions 460' and 465' are slightly overlapping, as are resultant output transitions 470' and 475'. In the conflict analysis of inverter 480, this conflict will be detected as a glitch having an overlap region 485. It should be noted that closely spaced input transitions need not be actually overlapping to produce output transitions that are overlapping. The probability of overlap calculated in probability_conflict 238 is equal to the product of probabilities corresponding to the portion of the histogram of transition 470' falling within conflict region 485 and to the portion of the histogram of transition 475' falling within conflict region 485.

Returning to FIGS. 5A and B, the operations of blocks 330 through 350 are performed by detectors 210. If an overlap is detected in block 330 and it is determined in block 340 that the overlap probability is above a predetermined minimum significant probability of conflict, then a glitch report/error record is made in block 350. If no overlapping signals were present, or if so, after an error report is made, control passes through point B to block 360.

In block 360 it is determined if more than one input of the current event is active, i.e., undergoing a level transition, at the same time. If not, control passes to block 370. If there are multiple active inputs, then control passes from block 360 to block 380, in which signal correlation is examined. If no signal correlation is found by block 380, control passes directly to block 390, otherwise control passes through block 400 before block 390. In block 400 correlation algebra 220 is called to remove any correlation.

Correlation algebra module 220 uses the correlation data structures created earlier, and performs correlation correction such as the standard reconvergent fanout analysis mentioned above. Reconvergent fanout analysis recognizes and handles situations in which a signal fans out into two or more different paths that then reconverge. Because these signals originate from the same source, any timing variations up through that point will apply equally to both, so timing variations between the signals can only arise after the fanout. The reconvergent fanout analysis recognizes when such signals reconverge, and reduces the variation between the signals by the amount of signal variation at the fanout point.

In block 390, the uncorrelated signals are combined using statistical_and module 234 and statistical_or module 236 to create a unified input signal histogram. Any delay uncertainty removed because of correlation is now added back to the histogram, after which control passes to block 370. In block 370 the component delay histogram is retrieved. Convolution of the two probability distributions (input signal and delay) is performed in block 410 by convolution module 232 (described in detail below), producing an output signal histogram that is saved for future use. Next, in block 420, the output histogram event is scheduled for all components for which it serves as an input (so long as there is some probability of a transition in the output level). After output events are scheduled, the netlist correlation information is updated by block 430, and the entire loop begins again at point A. One special case involves ring oscillators. Because these oscillators employ feedback loops, the oscillator output cannot be continually statistically reevaluated as an input, as this would wreak havoc with the signal uncertainty. Instead, the inverters that make up the ring oscillator are assumed to have a fixed delay after one cycle through.

Statistics Modules

Figure 7:
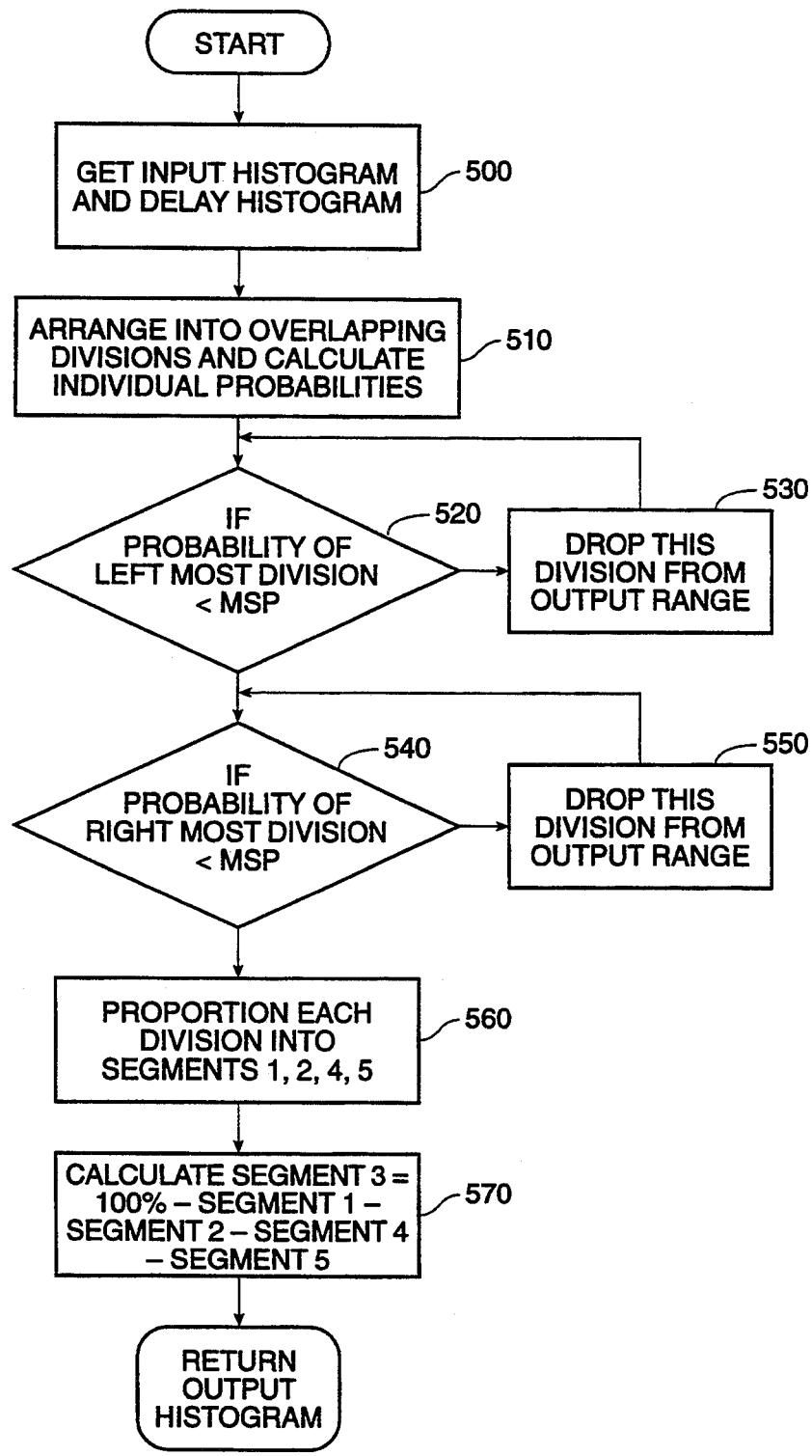
FIG. 7 is a flowchart illustrating the convolution process of combining an input transition histogram with a component delay histogram to produce an output transition histogram.
Figure 8A:
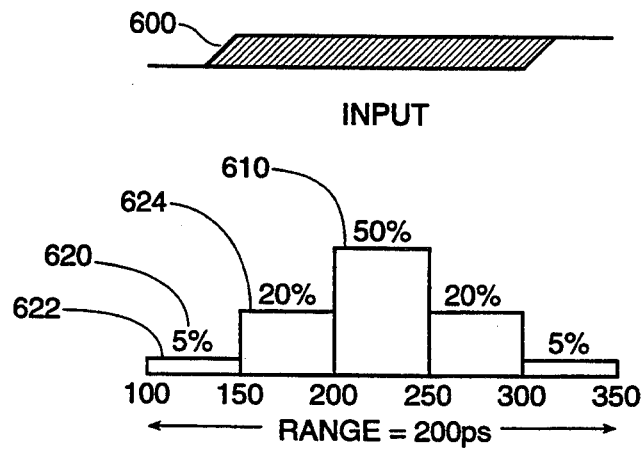
FIGS. 8A and 8B illustrate a signal transition and a component having delay, respectively, both having histograms, as used in an example regarding the process of FIG. 7.
Figure 8B:
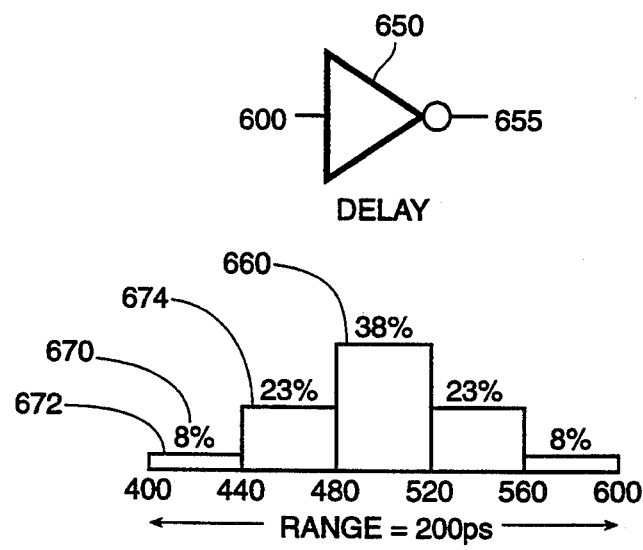
Figure 9:
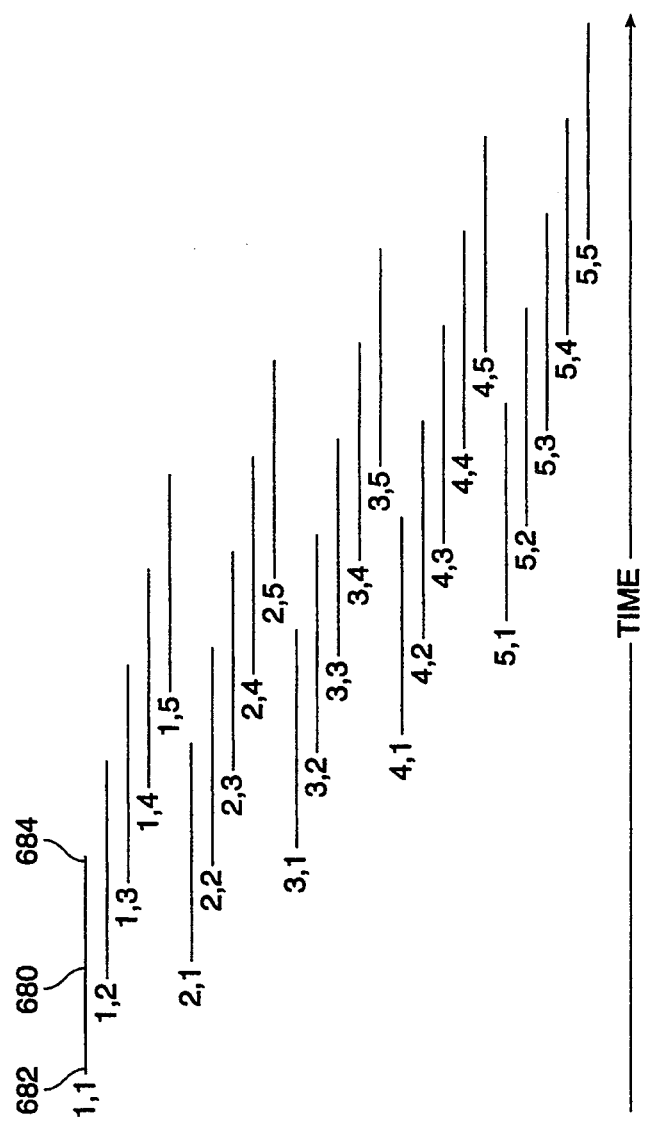
FIG. 9 illustrates probability divisions created during the convolution process.

The active input signals must be statistically evaluated. This evaluation is performed by convolution module 232, statistical_and module 234, and statistical_or module 236, which are related, and by conflict_probability 238. Statistical_and module 234 and statistical_or module 236 combine multiple input signal histograms into a single unified input signal histogram. Convolution module 232 combines an input signal histogram with a delay histogram to generate an output signal transition histogram. A flow chart for convolution module 232 is illustrated in FIG. 7. This flow chart will be explained with reference also to FIGS. 8A, 8B and 9. FIG. 8A illustrates a signal 600 undergoing a logic level transition from low to high within a certain time range. The corresponding histogram 610, of roughly normal distribution, has a first segment 620, which in turn has a begin time 622 and an end time 624. FIG. 8B illustrates an inverter 650 having signal 600 as an input and signal 655 as an output. The time delay of the inverter is represented by histogram 660, which has a first segment 670 having a begin time 672 and an end time 674. FIG. 9 illustrates a number of probability function divisions, such as division 680. Division 680 has a begin time 682 and an end time 684.

Returning to FIG. 7, the determination of the histogram describing the transition of output signal 655 will be described. In block 500 the relevant signal transition and component delay histograms, 610 and 660, are retrieved from memory, and in block 510 these histograms are combined to produce a set of divisions, as illustrated in FIG. 9. Each component delay histogram segment is paired with each signal transition histogram segment; with five segments in each, a total of 25 divisions are produced. Each division has a time range and associated probability. The starting point of the time range is equal to the begin time of the transition segment time range plus the begin time of the delay segment time range, the division end time is the sum of the segment range end times, and the division probability is the product of the two segment probabilities. In the examples, first signal segment 620 combines with first delay segment 670 to produce division 680. Division begin time 682 is equal to begin time 622 plus begin time 672, and division end time 684 is equal to end time 624 plus end time 674. Letting subscripted b represent the time range beginning, subscripted e represent the time range end, and subscripted p represent the associated probability, then the characteristics of an output division O(i,d) for input signal transition segment I(i) and delay segment D(d) can be written $$O_b(i,d) = I_b(i) + D_b(d)$$

$$O_e(i,d) = I_e(i) + D_e(d)$$

$$O_p(i,d) = I_p(i) * D_p(d).$$

In order to prevent histogram segments from having de minimis probability, the division probabilities are screened by being compared against a predetermined minimum significant probability, beginning at the extreme ranges. In the preferred embodiment this minimum significant probability is 0.5%, and is user selectable in 0.5% increments. In block 520 the (1,1) division (produced from transition segment 1 and delay segment 1) is examined. If it has insufficient probability it is dropped from consideration in block 530, and the comparison is repeated for the next division on the lower time range side. Once a division is reached with sufficient probability, the screening procedure is repeated in blocks 540 and 550 for the higher time range divisions, beginning at division (5,5). Control then passes to block 560, where the overall lowest remaining begin time is selected as the output histogram begin time, and the overall highest remaining end time is selected as the output histogram end time. The output segments are then each assigned one fifth of this histogram time range. The probabilities for segments 1,2,4 and 5 are then determined by summing the probabilities of the divisions that lie within each segment; if a division partially overlaps a segment, then a corresponding portion of its probability is assigned to the segment. The probability for segment 3 is then computed by subtracting the other segment probabilities from 100%. The output histogram is then completely specified.

Statistical_and module 234 and statistical_or module 236 combine signal transition histograms in a procedure somewhat different than that of convolution module 232. The time range of the resultant histogram (of the unified input signal histogram) is selected so as to entirely encompass the individual input histograms. In statistical_or module 236, the resultant histogram time range beginning is set to the earliest begin time of the input histograms, and the resultant histogram time range end is set to the earliest end time of the input histograms. In statistical_and module 234 the resultant histogram time range beginning and end is set to the later of the input histogram begin and end times, respectively. The input histograms are combined piece by piece to form intermediate probabilities that are then assigned to corresponding segments of the resultant histogram. The intermediate probabilities are calculated according to the statistical function being performed. For statistical_and, the intermediate probability is calculated as a sum of products. For statistical_or, the intermediate probability is calculated as a sum of combined probabilities, each combined probability being a sum of two histogram piece probabilities minus the product of the two probabilities. Complete details regarding these functions may be found in the source code appendix. in the files "statistical_and.c" and "statistical_or.c".

The use of statistical_and and statistical_or depends not only upon the type of component being modelled, but also upon its current output state. For example, if a nand gate output is low (all inputs high), the output will transition to a high logic level if any input signal transitions to a low logic level. If two inputs are transitioning in overlapping time frames, statistical_or module 236 would be used to determine the resultant histogram for the likelihood that the output will transition to high. If the nand gate output is high (at least one input low), the output will transition to a low logic level only if all input signals transition to a high logic level. In this case, if two inputs are transitioning in overlapping time frames, statistical_and module 236 would be used to determine the resultant histogram for the likelihood that the output will transition to low.

In summary, the circuit simulator of the preferred embodiment represents signal transitions and component delays probalistically, as histograms. The circuit operation is analyzed as a series of events, each event comprising the propagation of a signal transition through a component. Multiple input signal histograms are combined into a unified input signal histogram. Input signal histograms are combined with component delay histograms to produce output histograms through a form of statistical convolution. Output histograms are then scheduled with their receiving components, as new events for analysis. Once no more events remain, or the simulation time limit is reached, the simulation ends.

It is to be understood that the above description is intended to be illustrative only and not restrictive. Many other embodiments and variations will be apparent to those of skill in the art upon reviewing the above description. For instance, the same approach as described above may be used for direct timing analysis rather than simulation, or simply be used by one element of a software or hardware system that evaluates the timing of digital systems. Histograms having a variable number of segments or segments of unequal width could be used. Piece-wise defined probability distributions other than histograms could also be used, although perhaps at the expense of computational efficiency. The scope of the invention should, therefore, be determined with reference to the appended claims, along with the full scope of equivalents to which such claims are entitled.

What is claimed is:

1. A method of analyzing on a computer a signal transition propagation through a component, said component being one of a plurality of components of a digital circuit, each of said components having an input signal, an output signal, and a signal propagation delay time, said signals having logic level transitions over time, said computer having memory, said method comprising the step of:

associating said component with at least one input signal and at least one output signal;

scheduling at least one event comprising an input signal transition propagating through said component, and for each such event performing the steps of a) storing in said memory the signal propagation delay time of the component as a segmented probability distribution;

b) storing in said memory the input signal level transition time as a segmented probability distribution;

c) determinately combining the input signal transition probability distribution with the propagation delay probability distribution to generate the output signal transition time represented as a segmented probability distribution; and d) storing in said memory said output signal transition time probability distribution.

2. The method of claim 1, wherein a) the step of storing the signal propagation delay time of the component comprises storing a histogram having at least two segments, each segment having a time range and a probability corresponding to the likelihood of the delay time being within the segment time range;

b) the step of storing the input signal level transition time comprises storing a histogram having at least two segments, each segment having a time range and a probability corresponding to the likelihood of the input signal transition time being within the segment time range; and c) the step of storing the output signal transition time comprises storing a histogram having at least two segments, each segment having a time range and a probability corresponding to the likelihood of the output signal transition time being within the segment time range.

3. The method of claim 1, further comprising the step of reporting to a user a measure of the output signal probability distribution.

4. A method of analyzing on a computer a signal transition propagation through a component, said component being one of a plurality of components of a digital circuit, each of said components having an input signal, an output signal, and a signal propagation delay time, said signals having logic level transitions over time, said computer having memory, said method comprising the step of associating said component with at least one input signal and at least one output signal;

scheduling at least one event comprising an input signal transition propagating through said component, and for each such event performing the steps of storing in said memory the signal propagation delay time of the component as a segmented probability distribution;

storing in said memory the input signal level transition time as a segmented probability distribution;

determinately combining the input signal transition probability distribution with the propagation delay probability distribution to generate the output signal transition time represented as a segmented probability distribution; and storing in said memory said output signal transition time probability distribution;

wherein the step of storing the signal propagation delay time of the component comprises storing a histogram having at least two segments, each segment having a time range and a probability corresponding to the likelihood of the delay time being within the segment time range;

wherein the step of storing the input signal level transition time comprises storing a histogram having at least two segments, each segment having a time range and a probability corresponding to the likelihood of the input signal transition time being within the segment time range;

wherein the step of storing the output signal transition time comprises storing a histogram having at least two segments, each segment having a time range and a probability corresponding to the likelihood of the output signal transition time being within the segment time range;

wherein time ranges have a begin time and an end time, and wherein said combining step comprises the steps of i) combining the signal transition histogram segments with the delay histogram segments to generate divisions, each division having a time range and probability, by performing the steps of 1) adding transition histogram segment begin times to delay histogram segment begin times to produce division begin times;

2) adding transition histogram segment end times to delay histogram segment end times to produce division end times;

3) multiplying transition histogram segment probabilities by delay histogram segment probabilities to produce division probabilities ii) generating an output signal transition histogram from the divisions.

5. The method of claim 4, wherein the step of generating the output signal transition histogram comprises generating the output signal transition histogram from end-range divisions only if said end-range divisions have probabilities above a predetermined minimum probability.

6. A method of analyzing on a computer a digital circuit having a plurality of components, each of said components having an input signal, an output signal, and a signal propagation delay time, said signals having logic level transitions over time, said computer having memory, said method comprising the steps of:

scheduling events comprising an input signal transition propagating through a component, and for each event performing the steps of a) storing in said memory the signal propagation delay time of the event component as a segmented probability distribution;

b) storing in said memory the input signal level transition time as a segmented probability distribution;

c) determinately combining the input signal transition probability distribution with the propagation delay probability distribution to generate the output signal transition time represented as a segmented probability distribution; and d) storing in said memory said output signal transition time probability distribution.

7. A method of analyzing on a computer a digital circuit having a plurality of components, each of said components having an input signal, an output signal, and a signal propagation delay time, said signals having logic level transitions over time, said computer having memory, said method comprising the steps of scheduling events comprising an input signal transition propagating through a component, and for each event performing the steps of storing in said memory the signal propagation delay time of the event component as a segmented probability distribution;

storing in said memory the input signal level transition time as a segmented probability distribution;

determinately combining the input signal transition probability distribution with the propagation delay probability distribution to generate the output signal transition time represented as a segmented probability distribution; and storing in said memory said output signal transition time probability distribution;

wherein the input signal is a unified input signal, wherein components have combinatorial specifications and may have a plurality of individual input signals, and wherein the step of storing an input signal transition probability distribution comprises the steps of i) determining transition probability distributions for the component's individual input signals;

ii) combining the individual input transition probability distributions to form a unified input signal transition probability distribution; and iii) storing in said memory said unified input signal transition probability.

8. The method of claim 7, wherein the step of storing in said memory said unified input signal transition probability comprises storing a histogram having at least two segments, each segment having a time range and a probability corresponding to the likelihood of the unified input signal transition time being within the segment time range.

9. A method of analyzing on a computer circuit errors resulting from timing conflicts between signal transitions, said conflicts including overlapping signal transitions, said computer having memory, said method comprising the steps of:

a) determinately generating probabilities of occurrences of overlapping signal transitions;

b) storing in memory for said probabilities, a histogram having at least two segments, each segment having a time range and a probability corresponding to the likelihood of the difference between signal transitions being within the segment time range;

c) ranking circuit errors by probability of occurrence;

d) reporting to a user a selected portion of said ranked circuit errors.

10. A digital circuit simulator for analyzing a digital circuit comprising a plurality of components, said simulator comprising:

a) memory;

b) means for associating each of said components with an input signal and an output signal, said signals having logic level transitions over time;

c) means for scheduling events comprising an input signal transition propagating through a component;

d) means for storing in memory a signal propagation delay time, for the component associated with an event, as a segmented probability distribution;

e) means for storing in memory the input signal level transition time of said event as a segmented probability distribution;

f) means for generating the output signal transition time of said event by determinately combining the input signal transition probability distribution with the propagation delay probability distribution; and g) means for storing in memory said output signal transition time as a segmented probability distribution.

11. The digital circuit simulator of claim 10, further comprising means for reporting to a user a measure of the output signal transition probability distribution.

12. A digital circuit simulator for analyzing a digital circuit comprising a plurality of components, said simulator comprising memory;

means for associating each of said components with an input signal and an output signal, said signals having logic level transitions over time;

means for scheduling events comprising an input signal transition propagating through a component;

means for storing in memory a signal propagation delay time, for the component associated with an event, as a segmented probability distribution;

means for storing in memory the input signal level transition time of said event as a segmented probability distribution;

means for generating the output signal transition time of said event by determinately combining the input signal transition probability distribution with the propagation delay probability distribution; and means for storing in memory said output signal transition time as a segmented probability distribution;

wherein a) the input signal is a unified input signal;

b) components have combinatorial specifications and may have a multiplicity of individual input signals; and c) the means for storing an input signal transition probability distribution comprises i) means for determining transition probability distributions for the individual input signals of the component, and ii) means for determinately combining the individual input transition probability distributions to form a unified input signal transition probability distribution.

13. A digital circuit simulator for analyzing a digital circuit comprising a plurality of components, said simulator comprising memory;

means for associating each of said components with an input signal and an output signal, said signals having logic level transitions over time;

means for scheduling events comprising an input signal transition propagating through a component;

means for storing in memory a signal propagation delay time, for the component associated with an event, as a segmented probability distribution;

means for storing in memory the input signal level transition time of said event as a segmented probability distribution;

means for generating the output signal transition time of said event by determinately combining the input signal transition probability distribution with the propagation delay probability distribution;

means for storing in memory said output signal transition time as a segmented probability distribution;

further comprising means for analyzing circuit errors resulting from timing conflicts between signal transitions, said conflicts including overlapping input signal transitions, said simulator further comprising a) means for determinately evaluating probabilities of occurrences of overlapping input signal transitions;

b) means for ranking circuit errors by probability of occurrence; and c) means for reporting to a user a selected portion of said ranked circuit errors.

14. A method of simulating a circuit, comprising
identifying a component in a representation of said circuit;
associating a first probability distribution with said component, said first probability distribution comprising a plurality of registers, each one of said plurality of registers having a predetermined time range and a numeric probability value associated therewith;
associating an input signal and an output signal with said component;
associating a second probability distribution with said input signal;
determinately combining said first probability distribution and said second probability distribution to produce a third probability distribution; and
associating said third probability distribution with said output signal.

15. A method as in claim 14, wherein at least one of said first, second, and third probability distributions comprises a probability distribution that is not a uniform distribution or a normal distribution.

16. A method as in claim 14, wherein said first, second, and third probability distributions comprise histograms.

17. A method as in claim 14, wherein said step of determinately combining comprises convolution.

18. A method as in claim 14, wherein said step of determinately combining comprises
determining a plurality of resultant time ranges, each having a numeric begin time and a numeric end time, in response to said time ranges in said first probability distribution;
determining a plurality of resultant numeric probability values, in response to said numeric probability values in said first probability distribution; and
associating said plurality of resultant numeric probability values with said plurality of resultant time ranges.

19. A method as in claim 18, wherein said step of determinately combining comprises storing in memory a set of correlation information for said third probability distribution, said correlation information including a statistical correlation between said second probability distribution and said third probability distribution.

20. A method as in claim 18, wherein said step of determinately combining comprises
identifying at least one of said plurality of numeric probability values in said first probability distribution that is less than a predetermined threshold;
identifying a like number of said plurality of time ranges in said first probability distribution associated with said at least one numeric probability value; and
removing said at least one numeric probability value and said like number of said plurality of time ranges in said first probability distribution before determinately combining said first and said second probability distribution.

21. A method as in claim 18, wherein said step of determinately combining comprises
identifying at least one of said plurality of resultant numeric probability values that is less than a predetermined threshold;
identifying a like number of said resultant time ranges associated with said at least one resultant numeric probability value; and
removing said at least one resultant numeric probability value and said like number of said resultant plurality of time ranges from said third probability distribution.

22. A method of simulating a circuit, comprising
identifying a first and a second signal in a representation of said circuit;
associating a first probability distribution with said first signal and a second probability distribution with said second signal, said first probability distribution comprising a plurality of registers, each one of said plurality of registers having a predetermined time range and a numeric probability value associated therewith;
determinately combining said first probability distribution and said second probability distribution to produce a third probability distribution; and
associating said third probability distribution with a third signal for said circuit.

23. A method as in claim 22, comprising
determining a correlation value in response to said first and said second signals;
adjusting said first and said second probability distributions in response to said correlation value before determinately combining said first probability distribution and said second probability distribution.

24. A method as in claim 22, comprising associating said third probability distribution with an error for said circuit.

25. A method of simulating a circuit, comprising
identifying a first and a second signal in a representation of said circuit;
associating a first probability distribution with said first signal and a second probability distribution with said second signal, said first probability distribution comprising a plurality of registers, each one of said plurality of registers having a predetermined time range and a numeric probability value associated therewith;
determinately combining said first probability distribution arid said second probability distribution to produce a third probability distribution;
associating said third probability distribution with an error for said circuit;
associating a measure with said error in response to said probability distribution associated with said error;
ordering at least two said errors in response to said measure associated with each one of said errors; and
reporting a description of at least one of said errors in response to said step of ordering.

26. In a device for simulating a circuit, said device comprising means for identifying a component in a representation of said circuit, said component being associated with an input signal and an output signal, a data structure for representing a probability distribution, said data structure comprising a plurality of registers, each one of said plurality of registers associated with a time segment and a probability value, said time segments covering a continuous time range; and means for associating said plurality of registers with an event in said circuit, said event comprising a transition for said input signal, a transition for said output signal, or a delay for said component.

27. A data structure as in claim 26, wherein said probability values indicate a probability distribution that is not a uniform distribution or a normal distribution.

28. A data structure as in claim 26, wherein said probability values comprise a resultant of convolving a set of probability values in a first and a second said data structure.

* * * * *